United States Patent
Ryu et al.

(10) Patent No.: US 7,682,882 B2
(45) Date of Patent: Mar. 23, 2010

(54) METHOD OF MANUFACTURING ZNO-BASED THIN FILM TRANSISTOR

(75) Inventors: Myung-kwan Ryu, Yongin-si (KR); Sang-yoon Lee, Seoul (KR); Je-hun Lee, Seoul (KR); Tae-sang Kim, Seoul (KR); Jang-yeon Kwon, Seongnam-si (KR); Kyung-bae Park, Seoul (KR); Kyung-seok Son, Seoul (KR); Ji-sim Jung, Incheon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1 day.

(21) Appl. No.: 12/153,674

(22) Filed: May 22, 2008

(65) Prior Publication Data

US 2008/0318368 A1    Dec. 25, 2008

(30) Foreign Application Priority Data

Jun. 20, 2007    (KR) ...................... 10-2007-0060685
Feb. 29, 2008    (KR) ...................... 10-2008-0019304

(51) Int. Cl.
*H01L 21/00*    (2006.01)

(52) U.S. Cl. ...................... 438/149; 438/151; 257/613; 257/347; 257/59

(58) Field of Classification Search ................ 438/151, 438/149; 257/613, 347, 59
See application file for complete search history.

(56) References Cited

U.S. PATENT DOCUMENTS

| 6,900,461 | B2 * | 5/2005 | Inoue et al. | .................... 257/59 |
| 7,282,782 | B2 * | 10/2007 | Hoffman et al. | ............ 257/613 |
| 2003/0199117 | A1 * | 10/2003 | Kwon | .......................... 438/57 |
| 2005/0017302 | A1 * | 1/2005 | Hoffman | .................... 257/347 |

FOREIGN PATENT DOCUMENTS

| KR | 10-2004-0106576 | 12/2004 |
| KR | 10-2006-0123765 | 12/2006 |
| KR | 1020060123765 | 12/2006 |

* cited by examiner

*Primary Examiner*—Matthew Smith
*Assistant Examiner*—Wilner Jean Baptiste
(74) *Attorney, Agent, or Firm*—Harness, Dickey & Pierce, P.L.C.

(57) ABSTRACT

Provided is a method of manufacturing a ZnO-based thin film transistor (TFT). The method may include forming source and drain electrodes using one or two wet etchings. A tin (Sn) oxide, a fluoride, or a chloride having relatively stable bonding energy against plasma may be included in a channel layer. Because the source and drain electrodes are formed by wet etching, damage to the channel layer and an oxygen vacancy may be prevented or reduced. Because the material having higher bonding energy is distributed in the channel layer, damage to the channel layer occurring when a passivation layer is formed may be prevented or reduced.

15 Claims, 6 Drawing Sheets

METHOD OF MANUFACTURING ZNO-BASED THIN FILM TRANSISTOR

PRIORITY STATEMENT

This application claims priority under U.S.C. § 119 to Korean Patent Application No. 10-2007-0060685, filed on Jun. 20, 2007, and 10-2008-0019304, filed on Feb. 29, 2008, in the Korean Intellectual Property Office (KIPO), the entire contents of which are incorporated herein by reference.

BACKGROUND

1. Field

Example embodiments relate to a method of manufacturing a ZnO-based thin film transistor (TFT), and more particularly, to a method of manufacturing a ZnO-based TFT which may effectively prevent or reduce damage to a channel layer.

2. Description of the Related Art

Televisions (TVs) may be the main applications of rapidly progressing flat panel displays. While liquid crystal displays (LCDs) are the most widely used displays for TVs, many attempts have been made to use organic light-emitting diodes (OLEDs) for TVs. The displays for TVs that have been developed are large screen, digital information display (DID), with relatively low cost, and high quality in moving image, resolution, brightness, contrast, and color production, which may be important considerations in the market. A substrate, e.g., a glass substrate, may increase in size and a thin film transistor (TFT) having improved characteristics may be used as a display switching and driving element without increasing costs. Given this trend, efforts may be made to develop TFTs for higher quality displays at a lower cost.

Amorphous-silicon (a-Si) TFTs, which may be uniformly formed on a relatively large substrate up to 2 m or larger at a lower cost, may now be widely used as driving and switching elements for displays. However, because displays become larger and have higher image quality and thus driving and switching devices may also be required to have increased performance, existing a-Si TFTs having a low electron mobility of approximately 0.5 cm$^2$/Vs may suffer from limitations. Accordingly, high performance TFTs having an electron mobility higher than that of the a-Si TFTs may be developed. The a-Si TFTs have another problem in that as they may be operated for a long time, the performance of the a-Si TFTs may be degraded, thereby lowering reliability. For this reason, the a-Si TFTs may be more difficult to be applied to organic light emitting diodes (OLEDs), which emit light using continuously applied current, than to liquid crystal displays (LCDs).

Because poly-Si TFTs having much higher performance than that of a-Si TFTs have an increased mobility of tens to hundreds of cm$^2$/Vs, the poly-Si TFTs may be applied to higher quality displays for which existing a-Si TFTs may be unsuitable. In addition, the degradation of poly-Si TFTs may be much less than that of a-Si TFTs. However, in order to manufacture poly-Si TFTs, more processes than those required to manufacture a-Si TFTs may be required and additional equipment may be required. Accordingly, because poly-Si TFTs may be economically inferior to a-Si TFTs although the poly-Si TFTs may be suitable for higher quality displays or OLEDs, the poly-Si TFTs may suffer from limitations as well. Because poly-Si TFTs have not been manufactured on a relatively large substrate exceeding 1 m because of technical problems, e.g., equipment needs or undesirable uniformity, the poly-Si TFTs may be difficult to be applied to TVs, thereby making it more difficult for high performance poly-Si TFTs to survive and prosper in the market.

Accordingly, the demand for TFTs having a relatively large design, lower cost, and increased uniformity, which may be the advantages of a-Si TFTs, and increased performance and reliability, which may be the advantages of a poly-Si TFTS, may increase and research on the TFTs is being actively performed, e.g., research on an oxide semiconductor. Recently, ZnO-based TFTs have received increasing attention as oxide semiconductor devices. ZnO-based TFTs may include a zinc oxide (ZnOx) TFT, and a gallium-indium-zinc-oxide (GIZO) TFT that may be a mixture of gallium oxide (GaOx), indium oxide (InOx), and zinc oxide (ZnOx). According to the related art, while a ZnOx TFT, which may be polycrystalline, has an increased electron mobility similar to that of a poly-Si TFT but has lower uniformity, a GIZO TFT, which is amorphous, may have improved characteristics compared to those of a a-Si TFT and may offer both the advantages of the a-Si TFT and the poly-Si TFT because the GIZO TFT may be manufactured in the same manner as the a-Si TFT. However, any definite method of manufacturing a GIZO TFT has not been suggested and there may be several technical problems in manufacturing. A bottom gate back channel etching (BCE) TFT may be more desirable for several known reasons.

Because a GIZO semiconductor film may be amorphous, the GIZO semiconductor film may be processed at a lower temperature and may be more easily made larger. However, carrier concentration in a ZnO-based semiconductor film including the GIZO semiconductor film may be sensitive to a change in oxygen concentration, and the physical and electrical properties of the ZnO-based semiconductor film may be affected by thermal and chemical shock. When a ZnO-based TFT is manufactured, the ZnO-based semiconductor film may be exposed to high-energy plasma. The semiconductor film may suffer a defect, e.g., an oxygen vacancy, due to the decomposition of ZnO, resulting in an increase in the carrier concentration.

For example, when a bottom gate GIZO-based transistor is manufactured, a process of forming source and drain electrodes may be important, and the selectivity of a channel layer to a gate insulating layer may be particularly important in the process of forming the source and drain electrodes. If the channel layer under the source and drain electrodes is lost or the gate insulating layer outside the source and drain electrodes is over-etched and lost in the process of forming the source and drain electrodes, the bottom gate GIZO-based TFT may suffer undesirable performance and non-uniformity.

The source and drain electrodes may be typically formed by plasma etching. During plasma etching, a surface of the channel layer, e.g., a back channel, may be damaged, bonding between oxygen and each of Ga, In, and Zn may be broken down, and electrical conductivity may be increased. The increase in the electrical conductivity may make it difficult to control the threshold voltage of the bottom gate GIZO-based TFT and may decrease an on-off current ratio Ion/Ioff. To solve the problems, attempts have been made to restore the bonding between the oxygen and each of the Ga, In, and Zn through post-annealing or additional oxygen supply. However, such attempts have failed to correct the problems. Also, when a passivation layer, which may be a protective layer of the GIZO-based TFT, is deposited after the source and drain electrodes are formed, the surface of the channel layer may be damaged by plasma again.

SUMMARY

Example embodiments provide a method of manufacturing a ZnO-based thin film transistor (TFT) which may effectively prevent or reduce damage to a channel layer.

According to example embodiments, a method of manufacturing a ZnO-based TFT may include forming a gate on a substrate, forming a gate insulating layer on the gate, forming a ZnO-based channel layer on the gate insulating layer, forming a conductive material layer for forming electrodes, forming on the conductive material layer a mask layer having a pattern corresponding to source and drain electrodes on both sides of the channel layer, forming the source and drain electrodes by etching a portion of the conductive material layer not covered by the mask layer using a wet etchant having a higher selectivity with respect to the conductive material layer than the channel layer, and forming a passivation layer covering the source and drain electrodes and the channel layer.

Forming the channel layer may comprise including a tin (Sn) oxide in the channel layer. Ohmic layers may be formed between the channel layer and the source electrode and between the channel layer and the drain electrode. The channel layer may be formed by physical vapor deposition (PVD) including sputtering and evaporation. The gate insulating layer may be formed of silicon nitride (SiNx). The channel layer may be formed of gallium-indium-zinc-oxide (GIZO), and the gate insulating layer may be formed of SiNx.

The conductive material layer may include at least one multi-layer structure including at least one selected from the group consisting of Mo, Ti, Pt, Cu, Al, W, MoW, AlNd, Ni, Ag, Au, IZO, and ITO, or a silicide thereof. The conductive material layer may include Cu, Mo, and Al. Forming the source and drain electrodes may be performed by etching using a first etchant having water and a hydrogen peroxide as main components and a trace of hydrogen fluoride (HF).

Alternatively, the conductive material layer may be formed Mo, and forming the source and drain electrodes may be performed by etching using an etchant containing $HNO_3$, $H_3PO_4$, $CH_3COOH$, $H_2SO_4$, $NH_4OH$, KOH, $Cr_2O_3$, $CuCl_2$, $CuSO_4$, $H_2O_2$, CHI, HCOOH, HF, HNO3, $K3Fe(CN)_6$, KCN, KF, $KNO_3$, $MnO_4$, $NaCr_2O_7$, $NaNO_2$, NaOH, or $NaSO_4$.

Alternatively, forming the source and drain electrodes may be performed by two etchings using different etchants. The first etching may be performed using a second etchant having a phosphoric acid, a nitric acid, and an acetic acid as main components, and the second etching may be performed using the first etchant. The ZnO-based channel layer may be a $a(In_2O_3).b(Ga_2O_3).c(ZnO)$ layer where a, b, and c may be real numbers satisfying $a \geq 0$, $b \geq 0$, and $c \geq 0$. The channel layer may be a $a(In_2O_3).b(Ga_2O_3).c(ZnO)$ layer where a, b, and c may be real numbers satisfying $a \geq 1$, $b \geq 1$, and $0 < c \leq 1$. The chloride may include at least one selected from the group consisting of $GaCl_3$, $InCl_3$, and $ZnCl_2$, or $GaClx$, $InClx$, and $ZnCly$, where $0 < x \leq 3$ and $0 < y \leq 2$. The fluoride may include at least one selected from the group consisting of $GaF_3$, $InF_3$, and $ZnF_2$, or $GaFx$, $InFx$, and $ZnFy$, where $0 < x \leq 3$ and $0 < y \leq 2$.

BRIEF DESCRIPTION OF THE DRAWINGS

Example embodiments will be more clearly understood from the following detailed description taken in conjunction with the accompanying drawings. FIGS. 1-3G represent non-limiting, example embodiments as described herein.

FIG. 1 is a cross-sectional view of a ZnO-based thin film transistor (TFT) according to example embodiments;

FIGS. 3A-3G are cross-sectional views illustrating a method of manufacturing a TFT according to example embodiments.

Figure 1:
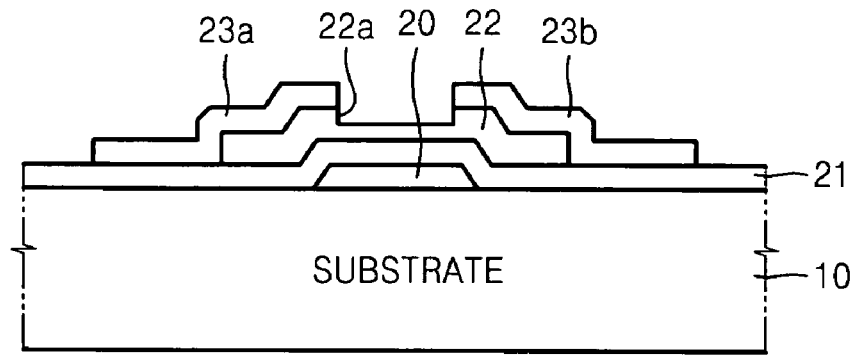

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described more fully with reference to the accompanying drawings, in which example embodiments are shown. In the drawings, the widths and thicknesses of layers or regions are exaggerated for clarity. Like reference numerals denote like elements in the drawings and repetitive description thereof will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a cross-sectional view of a ZnO-based thin film transistor (TFT) according to example embodiments. Referring to FIG. 1, a gate 20 may be formed on a substrate 10, and a gate insulating layer 21 covering the gate 20 may be formed on the substrate 10. A channel layer 22 corresponding to the gate 20 may be formed on the gate insulating layer 21. The channel layer 22 may have an over-etched portion 22a not covered by a source electrode 23a and a drain electrode 23b. The substrate 10 may be formed of a transparent or opaque material, e.g., silicon, glass, or plastic. The channel layer 22 may be formed of a ZnO-based material, e.g., gallium-indium-zinc-oxide (GIZO). For example, the GIZO may be $a(In_2O_3) \cdot b(Ga_2O_3) \cdot c(ZnO)$. The GIZO channel layer 22 may be formed by physical vapor deposition (PVD) including sputtering and evaporation.

The channel layer 22 may further include at least one selected from the group consisting of a tin (Sn) oxide, a chloride, and a fluoride which may be semiconductor materials. The chloride may be at least one selected from the group consisting of $GaCl_3$, $InCl_3$, and $ZnCl_2$, or $GaCl_x$, $InCl_x$, and $ZnCl_y$, where $0<x\leqq3$ and $0<y\leqq2$. The fluoride may be at least one selected from the group consisting of $GaF_3$, $InF_3$, and $ZnF_2$, or $GaF_x$, $InF_x$, and $ZnF_y$, where $0<x\leqq3$ and $0<y\leqq2$. The Sn oxide, the chloride, and the fluoride having bonding energy higher than that of ZnO may be more stable against plasma applied thereto in a manufacturing process than the ZnO.

The source electrode 23a and the drain electrode 23b may be formed on both sides of the channel layer 22 and extend to portions of the substrate 10 not covered by the channel layer 22. Each of the source electrode 23a and the drain electrode 23b may be formed of a metal, e.g., Mo, Ti, Pt, Cu, Al, W, MoW, AlNd, Ni, Ag, Au, IZO, or ITO. For example, each of the source electrode 23a and the drain electrode 23 may be any one selected from the group consisting of a copper (Cu) or molybdenum (Mo) single metal layer, a multi-metal layer including a Mo layer, a metal layer including titanium (Ti), and a metal layer including chromium (Cr). A thick passivation layer 24 (shown in FIGS. 2E-2F) may be formed on the channel layer 22, the source electrode 23a, and the drain electrode 23b. The passivation layer 24 may be formed of silicon nitride (SiNx) by plasma enhanced chemical vapor deposition (PECVD).

The channel layer 22, the source electrode 23a, the drain electrode 23b, the gate insulating layer 21, and the gate 20 may have thicknesses of about 30-200 nm, about 10-200 nm, about 10-200 nm, about 100-300 nm, and about 100-300 nm, respectively. Ohmic contact layers (not shown) may be disposed between the channel layer 22 and the source electrode 23a and between the channel layer 22 and the drain electrode 23b. The ohmic contact layers may be conductive oxide layers having an oxygen content less than that of the channel layer 22. The ohmic contact layers may reduce contact resistance between the channel layer 22 and the source electrode 23a and between the channel layer 22 and the drain electrode 23b, and may prevent or reduce holes from escaping from the channel layer 22.

When the channel layer 22 is formed, a SnO, chloride, or fluoride target may be deposited together with existing $Ga_2O_3$, $In_2O_3$, and ZnO targets using sputtering and evaporation so as to allow the channel layer 22 to include tin (Sn), fluorine (F), or chlorine (Cl). The ZnO-based channel layer 22 may be deposited by radio frequency (RF) sputtering. In this case, RF power may be about 100 to about 500 W, and gas introduced into a chamber during the sputtering may be argon (Ar) and diatomic oxygen ($O_2$). When the flow rate of Ar is about 100 sccm, the flow rate Of $O_2$ may range from about 0 to about 100 sccm.

According to the ZnO-based TFT of FIG. 1, the ZnO-based channel layer 22 may include a chloride or a fluoride. Chlorides ($GaCl_3$, $InCl_3$, and $ZnCl_2$) or fluorides ($GaF_3$, $InF_3$, or $ZnF_2$) have higher bonding energy than $Ga_2O_3$, $In_2O_3$, ZnO as shown in Table 1.

TABLE 1

| Element | Bonding Energy (kJ/mol at room temperature) | | | Comparison |
| | Oxide | Chloride | Fluoride | |
|---|---|---|---|---|
| Ga | 354 | 481 | | oxide < chloride |
| In | 320 | 439 | | oxide < chloride |
| Zn | 159 | 229 | 368 | oxide < chloride < fluoride |

Accordingly, when a SiNx passivation layer 24 is formed by PECVD after the channel layer 22 is patterned, the channel layer 22 exposed to plasma may be protected. Because the chloride or the fluoride having increased bonding energy and increased stability against plasma is present near a surface of the channel layer 22, an oxygen vacancy resulting from damage due to plasma may be reduced or prevented and an increase in carrier concentration may also be reduced or prevented. Referring to Table 1, ZnO may have the lowest bonding energy such that the ZnO may be first decomposed into Zn by plasma, an increase in carrier concentration due to Zn being the greatest, and bonding between the Zn and Cl may be the most common. Accordingly, for the purpose of reducing or preventing an increase in carrier concentration due to the ZnO having the lowest bonding energy, a larger amount of ZnCl or ZnF may need to be distributed near the surface of the channel layer 22 and the concentration of ZnO, which may be easily decomposed, may be reduced. Because the Sn oxide included in the channel layer 22 has an increased bonding energy of about 532 kJ/mol, plasma damage may be rare.

Example embodiments relate to a bottom gate back channel etching (BCE) TFT in which a gate may be formed under a channel layer, and particularly, relates to a bottom gate BCE TFT in which the concentration of Zn having lower bonding energy in a channel layer may be reduced and a Sn oxide, a chloride, or a fluoride having higher bonding energy may be formed near a surface of the channel layer to prevent or reduce plasma damage to the channel layer.

Figure 2A:
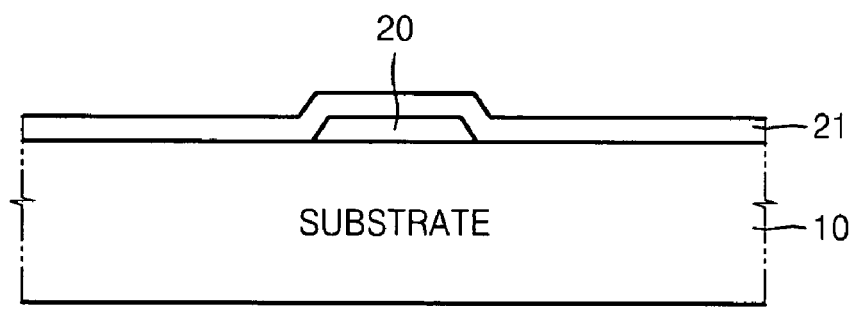
FIGS. 2A-2F are cross-sectional views illustrating a method of manufacturing a TFT according to example embodiments.

A method of manufacturing a ZnO-based TFT according to example embodiments will now be explained. FIGS. 2A-2F are cross-sectional views illustrating a method of manufacturing a TFT according to example embodiments. The same reference numerals in FIGS. 1 and 2A-2F denote the same elements. Referring to FIG. 2A, a gate 20 may be formed on a substrate 10, and a $SiO_2$ or $SiN_x$ gate insulating layer 21 covering the gate 20 may be formed on the substrate 10. Wet cleaning may be performed to remove impurities existing on a top surface of the gate insulating layer 21. A cleaning solution used in the wet cleaning may be at least one of isopropyl alcohol (IPA), deionized water, and acetone.

Figure 2B:
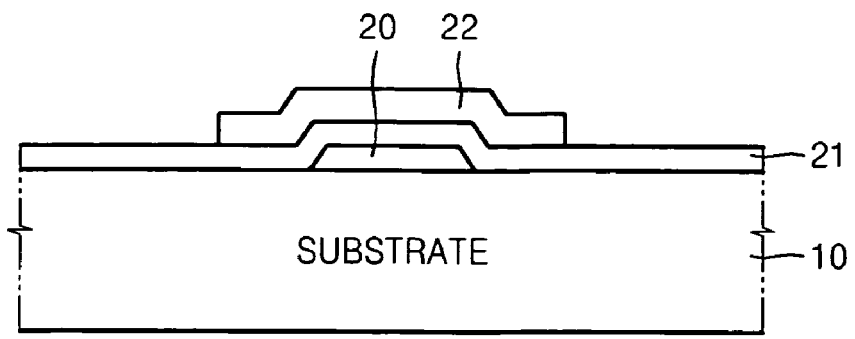

Referring to FIG. 2B, a channel layer 22 corresponding to the gate 20 may be formed on the gate insulating layer 21 such that the channel layer 22 may be disposed on the gate insulating layer 21 over the gate 20. The channel layer 22 may be formed by PVD including sputtering and evaporation. The channel layer 22 may be formed by sputtering at least one target of $In_2O_3$, $Ga_2O_3$, and ZnO. Accordingly, the channel layer 22 may have GIZO as a main material. The target may include any one of $GaCl_3$, $InCl_3$, and $ZnCl_2$ as a chloride and $GaF_3$, $InF_3$, and $ZnF_2$ as a fluoride.

Figure 2C:
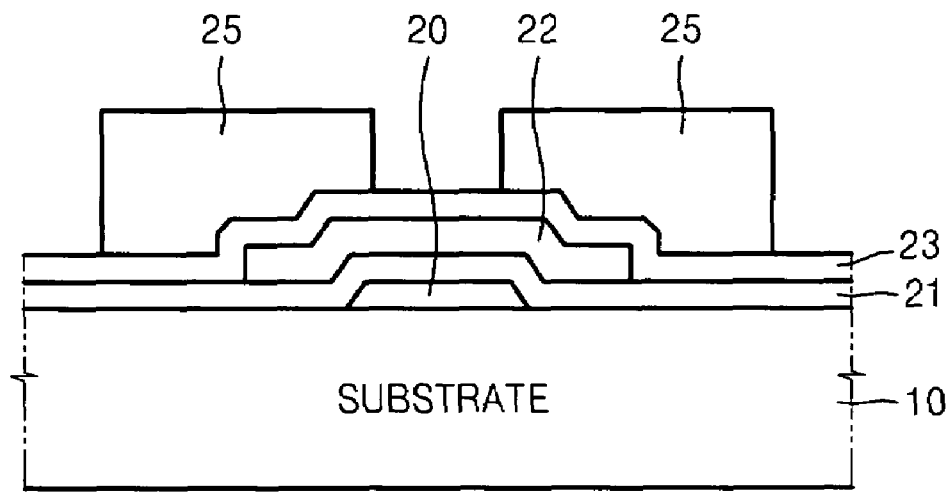

Referring to FIG. 2C, a metal layer 23 covering the channel layer 22 may be formed on the gate insulating layer 21, and then a photoresist mask 25 for forming a source electrode 23a and a drain electrode 23b may be formed on the metal layer 23. The metal layer 23 may be any one of a copper (Cu), molybdenum (Mo), or aluminum (Al) single metal layer, or a multi-layer structure, e.g., Mo/Cu, Mo/Al, Mo/AlNd, Mo/Al/Mo, Mo/AlNd/Mo, Ti/Al, Ti/AlNd, Ti/Al/Ti, or Ti/AlNd/Ti. For example, Pt, Cu, Al, W, MoW, AlNd, Ni, Ag, Au, IZO, ITO or a silicide thereof may be used. The metal layer 23 formed of the material may be formed by PVD.

Figure 2D:
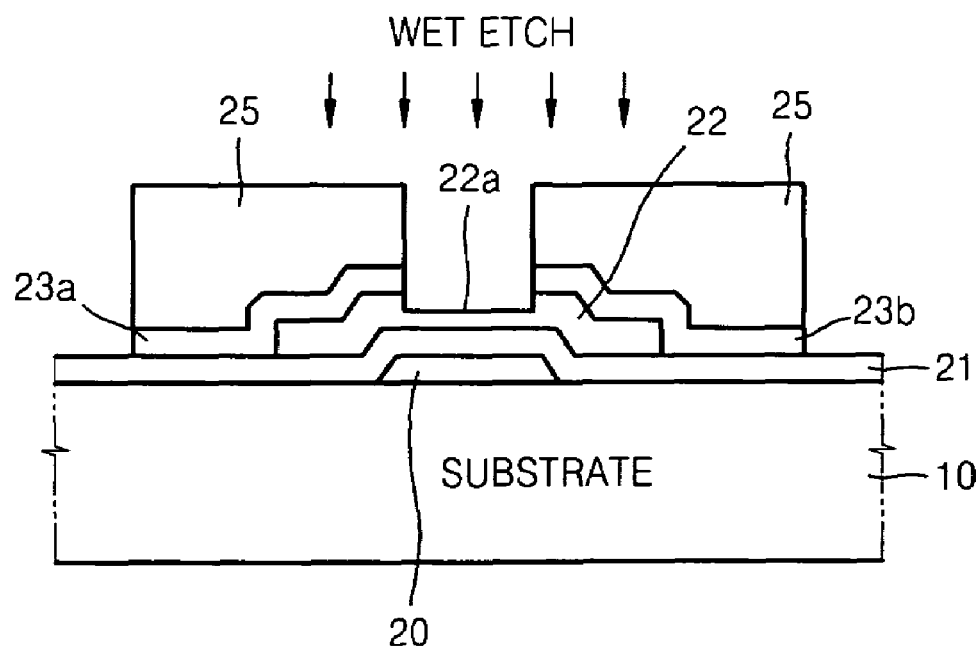

Referring to FIG. 2D, an exposed portion of the metal layer 23 not covered by the mask 25 may be etched using a wet etchant to form the source electrode 23a and the drain electrode 23b under the mask 25. An over-etched portion 22a may be formed on an exposed surface of the channel layer 22 between the source electrode 23a and the drain electrode 23b. The over-etched portion 22a may be formed during a removing process of a metal material completely from a back channel. The wet etchant may have a higher selectivity with respect to a metal than the channel layer 22. The wet etchant may be a first etchant having a phosphoric acid, a nitric acid, and an acetic acid as main components, or a second etchant having water and a hydrogen peroxide as main components and a trace of hydrogen fluoride (HF).

When the metal layer 23 is formed of Mo, an etchant may be nitric acid ($HNO_3$), phosphoric acid ($H_3PO_4$), acetic acid ($CH_3COOH$), sulfuric acid ($H_2SO_4$), an ammonia solution ($NH_4OH$), or a potassium hydroxide solution (KOH). For example, the etchant may be $Cr_2O_3$, $CuCl_2$, $CuSO_4$, $H_2O_2$, CHI, HCOOH, HF, HNO3, $K3Fe(CN)_6$, KCN, KF, $KNO_3$, $MnO_4$, $NaCr_2O_7$, $NaNO_2$, NaOH, or $NaSO_4$. Each of the Mo etchants may have a selectivity with respect to a Zn oxide, a In oxide, a Ga oxide, and a Sn oxide. Accordingly, the above oxide may be partially etched when the metal layer 23 is etched. The channel layer 22 may be desirably thick within a range of less than about 3000 Å. Because the desirably thick channel layer 22 is used, the function of the channel layer 22 may be maintained despite the etching, and the metal layer 23 formed of Mo may be successfully patterned. When the metal layer 23 is formed of Cu, a main component of an etchant may be $H_2O_2$. The wet etching may not cause damage to the channel layer 22, and thus, may not cause a difference in conductivity between back and front channels.

Figure 2E:
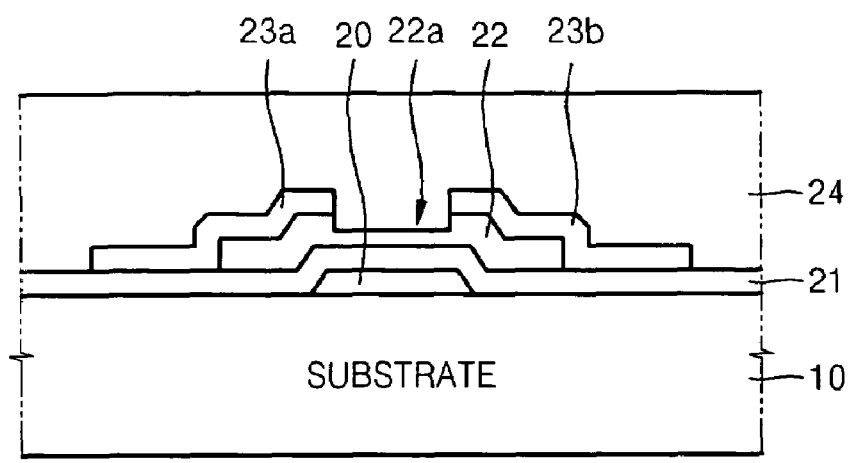

Referring to FIG. 2E, a passivation layer 24 covering the source electrode 23a and the drain electrode 23b may be formed by PECVD on the gate insulating layer 21. Before forming the passivation layer 24, a process of adding reactive oxygen to prevent or reduce plasma damage may be performed by directly treating a surface of the channel layer 22 with ozone ($O_3$), by applying ultraviolet rays and treating the surface of the channel layer 22 using $O_3$ produced by the ultraviolet rays in the atmosphere, or treating the surface of the channel layer 22 with $O_2$ plasma. As a result, an oxygen vacancy occurring in the channel layer 22 may be reduced or prevented.

Figure 2F:
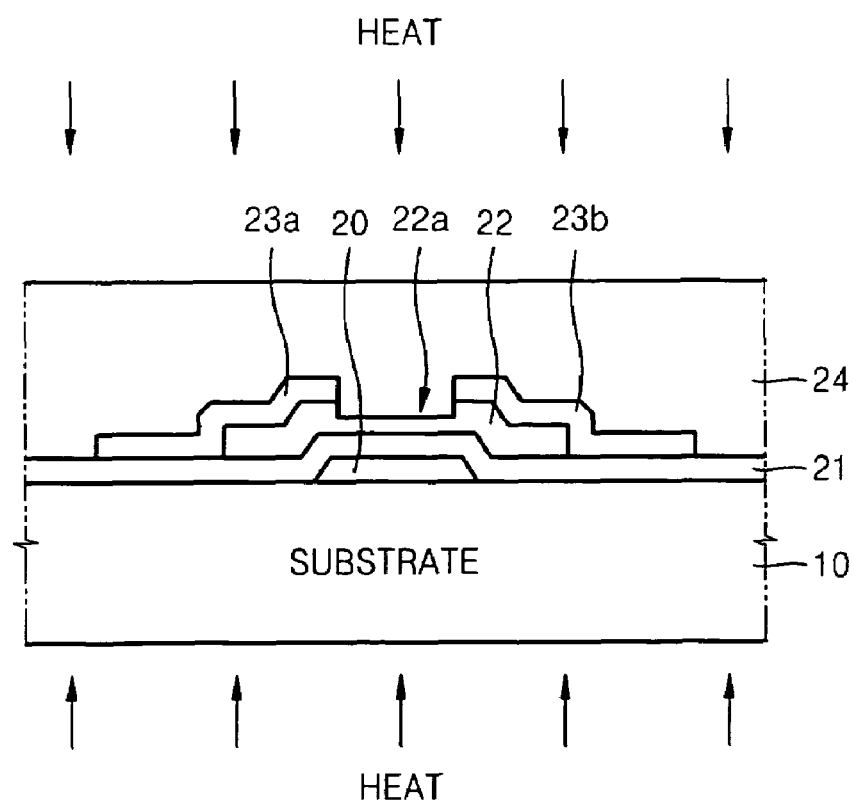

Referring to FIG. 2F, the channel layer 22 and the passivation layer 24 may be subjected to annealing. The annealing may be furnace annealing or rapid thermal annealing (RTA), and may be performed for about 10 minutes to about 2 hours at a temperature about 200° C. to about 400° C. in an oxygen or nitrogen atmosphere. For example, the annealing may be performed for about 1 hour at a temperature of about 200° C. Due to the annealing, carrier concentration in the channel layer 22 may be reduced, thereby obtaining a TFT having desired electrical properties and a desired threshold voltage. According to the method of FIGS. 2A-2F, the source and drain electrodes 23a and 23b may be formed by wet etching, and a Sn oxide, a fluoride, or a chloride, may be added to the channel layer 22.

Figure 3A:
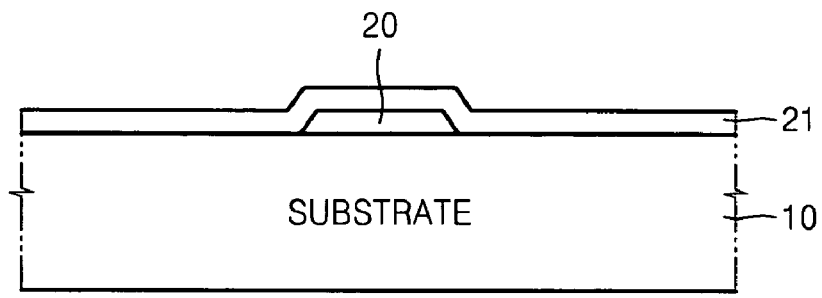

FIGS. 3A-3G are cross-sectional views illustrating a method of manufacturing a TFT according to example embodiments. The same reference numerals in FIG. 1 and FIGS. 3A through 3G denote the same elements. Referring to FIG. 3A, a gate 20 may be formed on a substrate 10, and a $SiO_2$ or $SiN_x$ gate insulating layer 21 covering the gate 20 may be formed on the substrate 10. Wet cleaning may be performed to remove impurities existing on a top surface of the gate insulating layer 21. A cleaning solution used in the wet cleaning may be at least one of IPA, deionized water, and acetone.

Figure 3B:
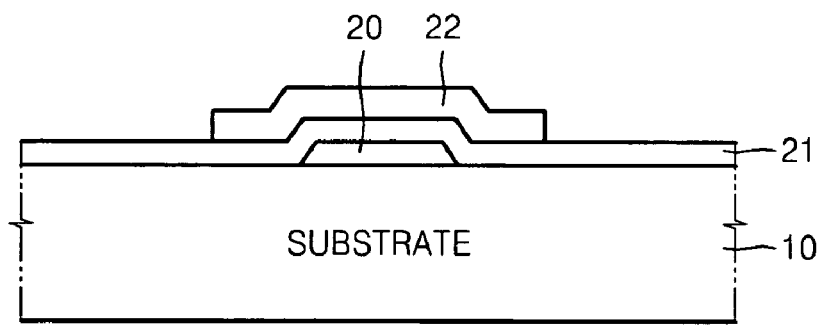

Referring to FIG. 3B, a channel layer 22 corresponding to the gate 20 may be formed on the gate insulating layer 21. The channel layer 22 may be the same as described above with reference to FIG. 2B. For example, the channel layer 22 may be formed by PVD including sputtering and evaporation. The channel layer 22 may be formed by sputtering at least one target of $In_2O_3$, $Ga_2O_3$, and ZnO. Accordingly, the channel layer 22 may have GIZO as a main material. The target may include any one of $GaCl_3$, $InCl_3$, and $ZnCl_2$ as a chloride and $GaF_3$, $InF_3$, and $ZnF_2$ as a fluoride.

Figure 3C:
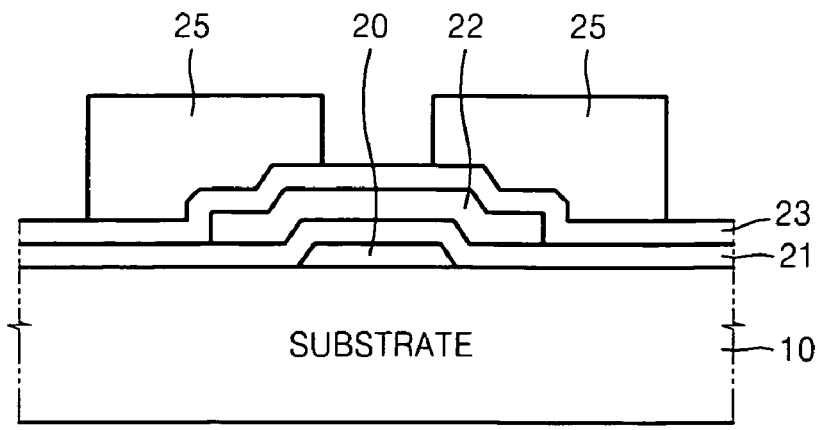
Figure 3D:
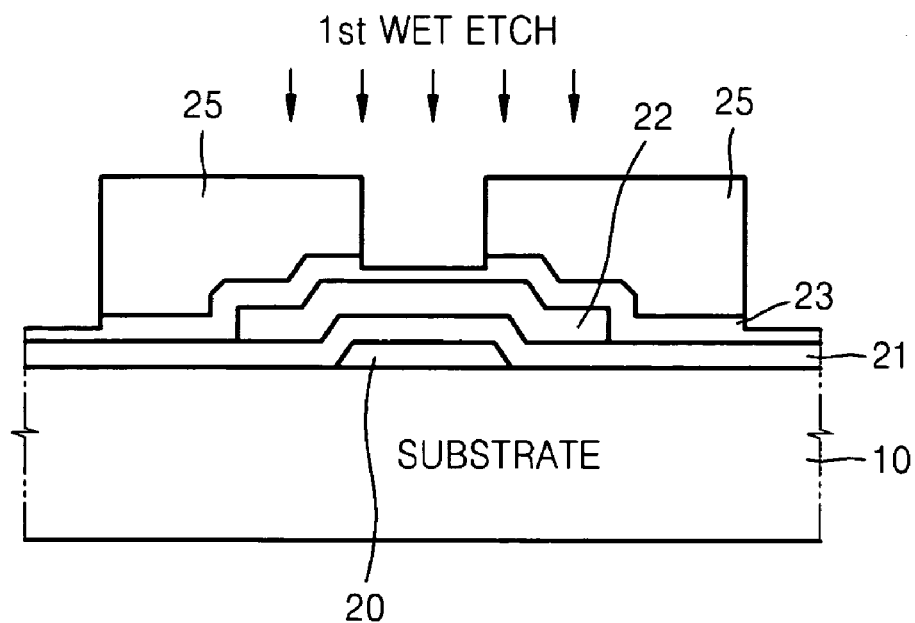
Figure 3E:
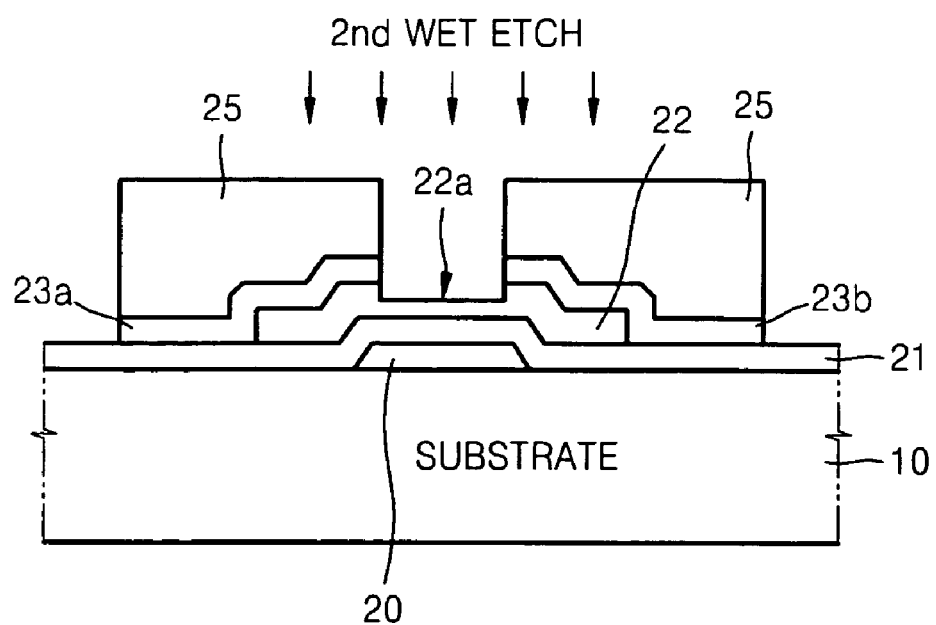

Referring to FIG. 3C, a metal layer 23 covering the channel layer 22 may be formed on the gate insulating layer 21, and then a photoresist mask 25 for forming a source electrode 23a and a drain electrode 23b may be formed on the metal layer 23. The metal layer 23 may be any one of a Cu, Mo, or Al single metal layer, or a multi-layer structure, e.g., Mo/Cu, Mo/Al, Mo/AlNd, Mo/Al/Mo, Mo/AlNd/Mo, Ti/Al, Ti/AlNd, Ti/Al/Ti, or Ti/AlNd/Ti. For example, Pt, Cu, Al, W, MoW, AlNd, Ni, Ag, Au, IZO, ITO or a silicide thereof may be used. The metal layer 23 formed of the material may be formed by PVD. For example, the metal layer 23 may include at least one selected from the group consisting of Cu, Mo, and Al. Referring to FIGS. 3D and 3E, an exposed portion of the metal layer 23 not covered by the mask 25 may be etched by two etchings to form the source electrode 23a and the drain electrode 23b under the mask 25.

Referring to FIG. 3D, the first etching may be performed using a first etchant having a phosphoric acid, a nitric acid, and an acetic acid as main components, such that only about 50 to about 80% of the thickness of the metal layer 23 may be etched away. Referring to FIG. 3E, the second etching may be performed using a second etchant having water and a hydrogen peroxide as main components and a trace of HF, such that the exposed portion of the metal layer 23 not covered by the mask 25 may be completely removed, the source and drain electrodes 23a and 23b may be formed, and an over-etched portion 22a may be formed on a surface of the channel layer 22. The wet etchings may not cause damage to the channel layer 22, and thus, may not cause a difference in conductivity between back and front channels.

Figure 3F:
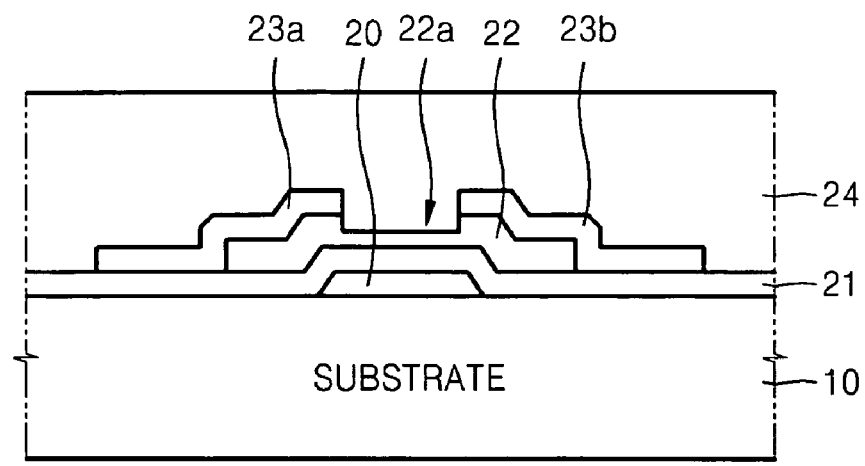
Figure 3G:
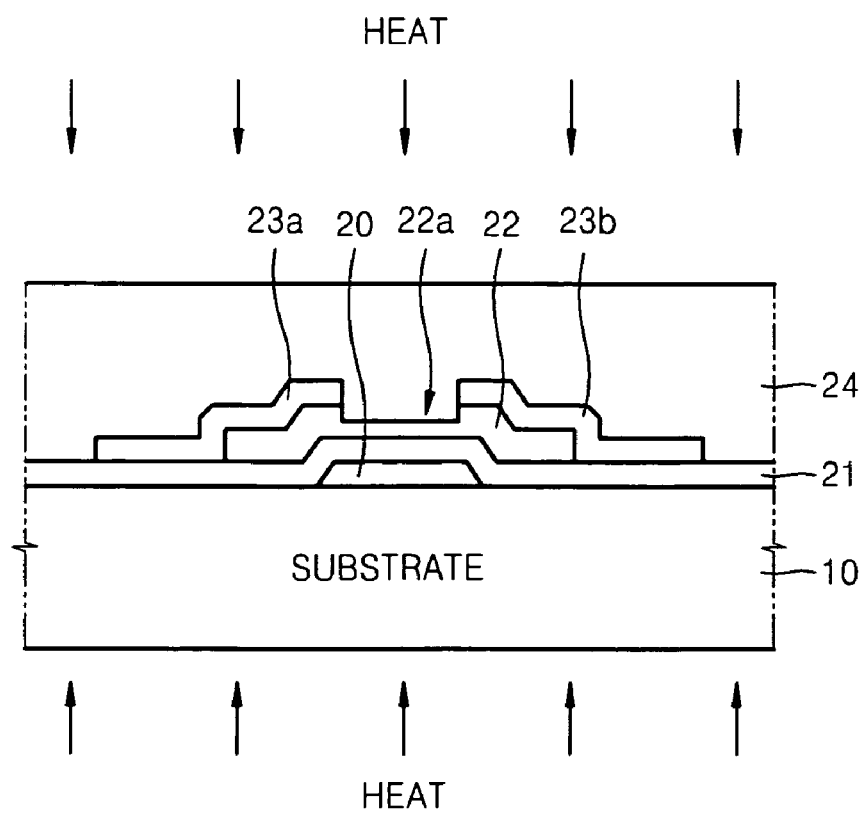

Referring to FIG. 3F, a passivation layer 24 covering the source electrode 23a and the drain electrode 23b may be formed by PECVD on the gate insulating layer 21. Before forming the passivation layer 24, a process of adding reactive oxygen to prevent or reduce plasma damage to the passivation layer 24 may be performed by directly treating a surface of the channel layer 22 with $O_3$, by applying ultraviolet rays and treating the surface of the channel layer 22 using $O_3$ produced by the ultraviolet rays in the atmosphere, or treating the surface of the channel layer 22 with $O_2$ plasma. As a result, an oxygen vacancy occurring in the channel layer 22 may be prevented or reduced.

Referring to FIG. 3F, the channel layer 22 and the passivation layer 24 may be subjected to annealing. The annealing may be furnace annealing or rapid thermal annealing (RTA), and may be performed for about 10 minutes to about 2 hours at a temperature about 200° C. to about 400° C. in oxygen or nitrogen atmosphere. For example, the annealing may be performed for about 1 hour at a temperature of about 200° C. Due to the annealing, carrier concentration in the channel layer 22 may be reduced, thereby obtaining a TFT having desired electrical properties and a desired threshold voltage.

According to the method of FIGS. 3A-3G, the source and drain electrodes 23a and 23b may be formed by two wet etchings, and a Sn oxide, a fluoride, or a chloride, may be added to the channel layer 22. As described above, because the method of manufacturing the TFT according to example embodiments uses wet etching to form the source and drain electrodes, plasma damage may be reduced. Because the Sn oxide, chloride, and fluoride having increased bonding energy may be included in the channel layer, plasma damage may be further reduced when the passivation layer may be formed. Accordingly, the method according to example embodiments may obtain a TFT having desired electrical properties.

The method of manufacturing the TFT according to example embodiments may be applied to a liquid crystal display (LCD) and an organic light-emitting diode (OLED) which require a larger switching element. For example, the method according to example embodiments may be applied to an oxide semiconductor TFT substituting for a conventional amorphous silicon TFT (a-Si TFT) or a poly silicon TFT (poly-Si TFT), and may be applied to a flat panel display, e.g., to an LCD and an OLED which require a TFT-based switching and driving element. The method according to example embodiments may also be applied to a cellular phone, a mobile device, a notebook computer, a monitor, and a television (TV) which employ an LCD or an OLED.

While example embodiments have been particularly shown and described with reference to example embodiments thereof, it will be understood by those of ordinary skill in the art that various changes in form and details of the TFT according to example embodiments may be made therein and the TFT according to example embodiments may be applied to a memory device and a logic device as well as an LCD or an OLED without departing from the spirit and scope of the following claims.

What is claimed is:

1. A method of manufacturing a ZnO-based thin film transistor (TFT, the method comprising:
    forming a ZnO-based channel layer on a gate insulating layer;
    forming a conductive material layer on the gate insulating layer and the ZnO-based channel layer;
    forming a mask layer on the conductive material layer having a pattern corresponding to source and drain electrodes on both sides of the ZnO-based channel layer;
    forming the source and drain electrodes by etching the conductive material layer not covered by the mask layer using a wet etchant having a higher selectivity with respect to the conductive material layer than the ZnO-based channel layer; and
    forming a passivation layer covering the source and drain electrodes and the ZnO-based channel layer,
    wherein the source and drain electrodes are formed by a first etching to remove a portion of the conductive material layer not covered by the mask layer, and a second etching to completely remove the portion of the conductive material layer not covered by the mask layer and over-etch the surface of the ZnO-based channel layer, so that the ZnO-based channel layer includes an over-etched portion between the source electrode and the drain electrode.

2. The method of claim 1, wherein at least one of a tin (Sn) oxide, a fluoride, and a chloride is further included in the ZnO-based channel layer.

3. The method of claim 2, wherein the fluoride includes at least one selected from the group consisting of $GaF_3$, $InF_3$, and $ZnF_2$.

4. The method of claim 2, wherein the chloride includes at least one selected from the group consisting of $GaCl_3$, $InCl_3$, and $ZnCl_2$.

5. The method of claim 1, wherein the ZnO-based channel layer is formed of gallium-indium-zinc-oxide (GIZO).

6. The method of claim 5, wherein the ZnO-based channel layer further includes at least one of a tin (Sn) oxide, a fluoride, and a chloride.

7. The method of claim 1, wherein:
    a first etchant for the first etching has a phosphoric acid, a nitric acid, and an acetic acid as main components; and a second etchant for the second etching has water and a hydrogen peroxide as main components and a trace of hydrogen fluoride (HF).

8. The method of claim 7, wherein each of the source and drain electrodes is formed of at least one selected from the group consisting of Cu, Mo, Al, Mo/Cu, Mo/Al, Mo/AlNd, Mo/Al/Mo, Mo/AlNd/Mo, Ti/Al, Ti/AlNd, Ti/Al/Ti, and Ti/AlNd/Ti.

9. The method of claim 8, wherein the conductive material layer includes at least one multi-layer structure including at least one selected from the group consisting of Mo, Ti, Pt, Cu, Al, W, MoW, AlNd, Ni, Ag, Au, IZO, and ITO, or a silicide thereof.

10. The method of claim 8, further comprising:
injecting active oxygen into a surface of the ZnO-based channel layer, before forming the passivation layer.

11. The method of claim 7, wherein the conductive material layer includes at least one multi-layer structure including at least one selected from the group consisting of Mo, Ti, Pt, Cu, Al, W, MoW, AlNd, Ni, Ag, Au, IZO, and ITO, or a silicide thereof.

12. The method of claim 7, further comprising:
injecting active oxygen into a surface of the ZnO-based channel layer, before forming the passivation layer.

13. The method of claim 1, wherein the conductive material layer includes at least one multi-layer structure including at least one selected from the group consisting of Mo, Ti, Pt, Cu, Al, W, MoW, AlNd, Ni, Ag, Au, IZO, and ITO, or a silicide thereof.

14. The method of claim 1, further comprising:
injecting active oxygen into a surface of the ZnO-based channel layer, before forming the passivation layer.

15. The method of claim 1, before forming the ZnO-based channel layer on the gate insulating layer, further comprising:
forming a gate on a substrate; and
forming a gate insulating layer on the gate.

* * * * *